United States Patent
Lee et al.

(10) Patent No.: US 8,372,673 B2
(45) Date of Patent: Feb. 12, 2013

(54) METHOD OF SEPERATING TWO MATERIAL SYSTEMS

(75) Inventors: Ya-Ju Lee, Hsinchu (TW); Ta-Cheng Hsu, Hsinchu (TW); Min-Hsun Hsieh, Hsinchu (TW)

(73) Assignee: Epistar Corporation (TW)

( * ) Notice: Subject to any disclaimer, the term of this patent is extended or adjusted under 35 U.S.C. 154(b) by 551 days.

(21) Appl. No.: 12/285,905

(22) Filed: Oct. 16, 2008

(65) Prior Publication Data

US 2009/0111205 A1 Apr. 30, 2009

(30) Foreign Application Priority Data

Oct. 16, 2007 (TW) .............................. 96138802 A

(51) Int. Cl.
*H01L 21/00* (2006.01)

(52) U.S. Cl. .......... 438/46; 438/458; 438/459; 438/455; 438/460; 438/464; 257/99; 257/98; 257/94; 257/89; 257/82

(58) Field of Classification Search .................. None
See application file for complete search history.

(56) References Cited

U.S. PATENT DOCUMENTS

| | | | | |
|---|---|---|---|---|
| 6,303,405 B1 * | 10/2001 | Yoshida et al. | ................. | 438/46 |
| 2005/0215000 A1 * | 9/2005 | Negley | ........................... | 438/200 |
| 2007/0059852 A1 * | 3/2007 | Miyachi et al. | ................. | 438/22 |
| 2007/0141741 A1 * | 6/2007 | Suh et al. | ........................ | 438/44 |
| 2009/0061636 A1 * | 3/2009 | Lee et al. | ....................... | 438/703 |

* cited by examiner

*Primary Examiner* — Julio J Maldonado
*Assistant Examiner* — Shantanu C Pathak
(74) *Attorney, Agent, or Firm* — Bacon & Thomas, PLLC

(57) ABSTRACT

An embodiment of this invention discloses a method of separating two material systems, which comprises steps of providing a bulk sapphire; forming a nitride system on the bulk sapphire; forming at least two channels between the bulk sapphire and the nitride system; etching at least one inner surface of the channel; and separating the bulk sapphire and the nitride system.

4 Claims, 12 Drawing Sheets

(A)

(B)

(A)

(B)

METHOD OF SEPERATING TWO MATERIAL SYSTEMS

TECHNICAL FIELD

The invention relates to a method of separating two material systems, and more particularly to a method of removing sapphire substrate by wet etching.

REFERENCE TO RELATED APPLICATION

This application claims the right of priority based on Taiwan application Ser. No. 096138802, filed Sep. 16, 2007, and the content of which is hereby incorporated by reference.

DESCRIPTION OF BACKGROUND ART

GaN series material has been widely used in blue and ultraviolet optoelectronic devices since it was introduced to the development of MIS (Metal-Insulator-Semiconductor) diode in the early 1970s and p-n structure light-emitting diode (LED) from the 1990s. GaN series material is characterized by its wide direct band gap, thermal stability, and chemical stability. GaN bulk is not easily fabricated, and therefore a substrate of hetero-material, such as sapphire and silicon carbide, is inevitably used to grow GaN structure. Most of all, the sapphire substrate which is reported to have 14% lattice mismatch to GaN becomes the mainstream in the market.

Nevertheless, sapphire is commonly known as an electrical insulator and has poor thermal conductivity. To make a vertical type nitride light-emitting diode, or to improve the thermal dissipation performance of the light-emitting diode, a technology using an alternative carrier for replacing the sapphire also comes into practice. One of the separation methods called "laser lift-off" uses Nd-YAG or excimer laser to decompose GaN into gallium and nitrogen, and thus remove the sapphire substrate. However, it is not easy to control the laser beam penetration depth to stop just before the primary epitaxial structure so that the light-emitting quality is often deteriorated. The pertinent literature can be referred to U.S. Pat. No. 6,559,075 and No. 6,071,795.

SUMMARY OF THE DISCLOSURE

Present invention provides several methods of separating bulk sapphire from the epitaxial structure, or making two material systems apart.

A method of separating two material systems in accordance with an embodiment of present invention includes steps of providing a bulk sapphire; forming a nitride system on the bulk sapphire; forming at least two open channels between the bulk sapphire and the nitride system; etching at least one inner surface of the open channels; and separating the bulk sapphire from the nitride system.

A method of separating two material systems in accordance with one embodiment of present invention includes steps of providing a first material system; forming a second material system to contact the first material system in a patterned contact area; shrinking the patterned contact area between the first material system and the second material system until an unsustainable connection is formed therebetween.

A method of separating two material systems in accordance with another embodiment of present invention includes steps of providing a first material system; forming a plurality of material channels on the first material system; forming a second material system on the channels; removing the material channels to become open channels; and wet-etching the open channels to shrink a contact area between the first material system and the second material system until a stable connection is not sustainable therebetween.

A method of separating two material systems in accordance with further embodiment of present invention includes steps of providing a first material system; dry-etching the first material system to form an open channel; forming a second material system on the first material system; wet-etching the open channel; and separating the first material system and the second material system from each other.

A method of separating two material systems in accordance with another embodiment of present invention includes steps of providing a first material system; providing a second material system on the first material system; forming a plurality of open channels between the first material system and the second material system; providing an etchant having an etching rate difference between the first material system and the second material system by 50~10000 order; wet-etching the open channels by using the etchant to shrink a contact area between the first material system and the second material system until a stable connection is not sustainable therebetween.

DETAILED DESCRIPTION OF PREFERRED EMBODIMENTS

The embodiments are described hereinafter in accompany with drawings.

FIGS. 1A~1E illustrate an embodiment of present invention. An etching layer (not shown) is firstly deposited on a sapphire substrate 10 and then partly removed to form material channels 13 configured in a specific pattern by using photolithography technology. In addition, the material channels can also be used as a template in the epitaxial lateral overgrowth method. A first nitride system 11 and a second nitride system 12 are then sequentially formed on the material channels 13 and the sapphire substrate 10. The first nitride system 11 is functioned as a buffer layer of the second nitride system 12 so as to reduce the dislocation density among the system 12.

The first nitride system 11 has a composition of nitride series materials such as u-GaN, AlN, AlGaN, InAlN, or a combination of AlN, GaN, and InN. The first nitride system 11 can be formed by using metal-organic chemical vapor deposition (MOCVD) or hydride vapour phase epitaxy (HVPE) etc. Japanese patent No. 2,141,400, Japanese laid-open patent publication No. 2004-289095, and U.S. Pat. No. 5,122,845 disclose subject matters pertinent to aforementioned method, and the content of which is hereby incorporated by reference. In one embodiment, the first nitride system 11 includes AlN, GaAlN, and u-GaN layers which are sequentially formed on the sapphire substrate 10. In another embodiment, the first nitride system 11 includes a $Ga_xAl_{x-1}N$ layer ($0 \leq x \leq 1$).

The second nitride system 12 includes at least a light-emitting layer, a p-type nitride layer and an n-type nitride layer positioned on opposite sides of the light-emitting layer. The light-emitting layer is formed in a structure such as single heterostructure (SH), double heterostructure (DH), double-side double heterostructure (DDH), and multi-quantum well (MQW). The composition of each of the light-emitting layer, p-type nitride layer, and n-type nitride layer is formulated as $Al_xGa_yIn_zN$ ($x+y+z=1$). In addition, the second nitride system 12 can further include other non-nitride or semiconductor materials, such as metal, organic material, insulator, and oxide. In one embodiment, an indium tin oxide (ITO) layer can be integrated in the system to improve the lateral current spreading ability. Moreover, the outer or inner surface(s) of the second nitride system 12 can be texturized to produce a specific light-field or elevate the light extraction efficiency. U.S. Pat. Nos. 5,779,924, 5,792,698, and Japanese laid-open patent publication No. 2003-110136 disclose subject matters pertinent to aforementioned technologies, and the content of which is hereby incorporated by reference. The second nitride system 12 can be formed by using metal-organic chemical vapor deposition (MOCVD) or hydride vapour phase epitaxy (HVPE) etc.

Figure 1A:
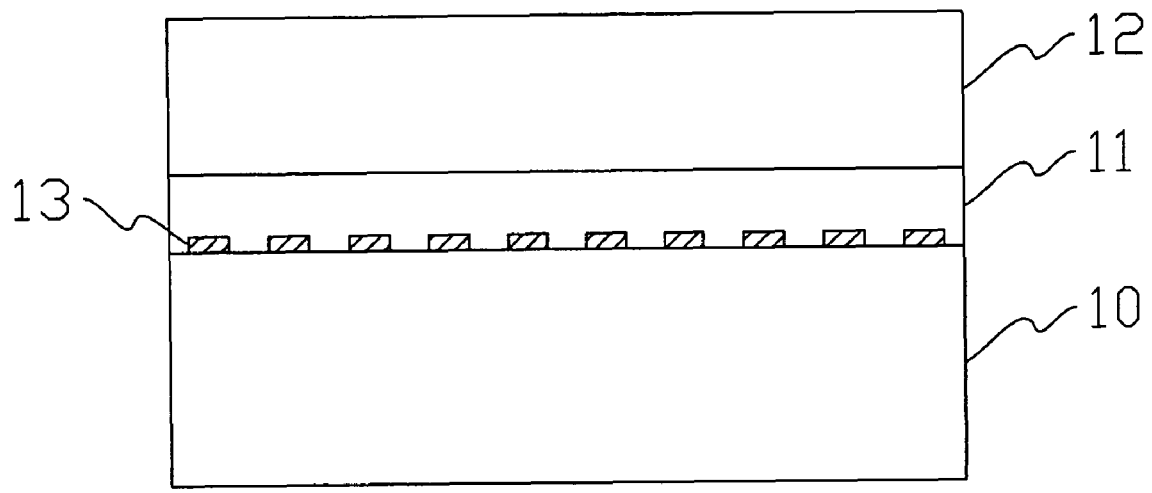
FIGS. 1A~1E illustrate a method of separating sapphire substrate in accordance with an embodiment of present invention.
Figure 1B:
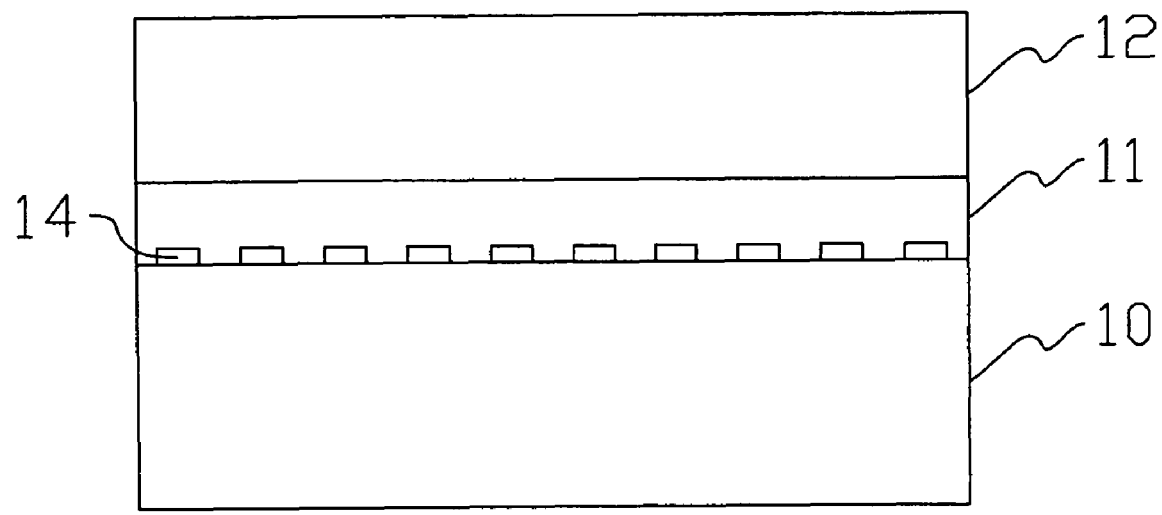

As shown in FIG. 1B, a specific etchant is used to etch the material channels 13 to form open channels 14. In one embodiment, the material channels 13 are made of $SiO_2$; and the etchant is potassium hydroxide (KOH) having a purity of 85% or more. The etching temperature is ranged between 170° C. and 250° C. It is reported that the etching rate of $SiO_2$ in 230° C. by potassium hydroxide can reach 10 μm/min or more. The reaction between $SiO_2$ and potassium hydroxide can be formulated as follows:

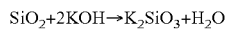

$$SiO_2 + 2KOH \rightarrow K_2SiO_3 + H_2O$$

Figure 1C:
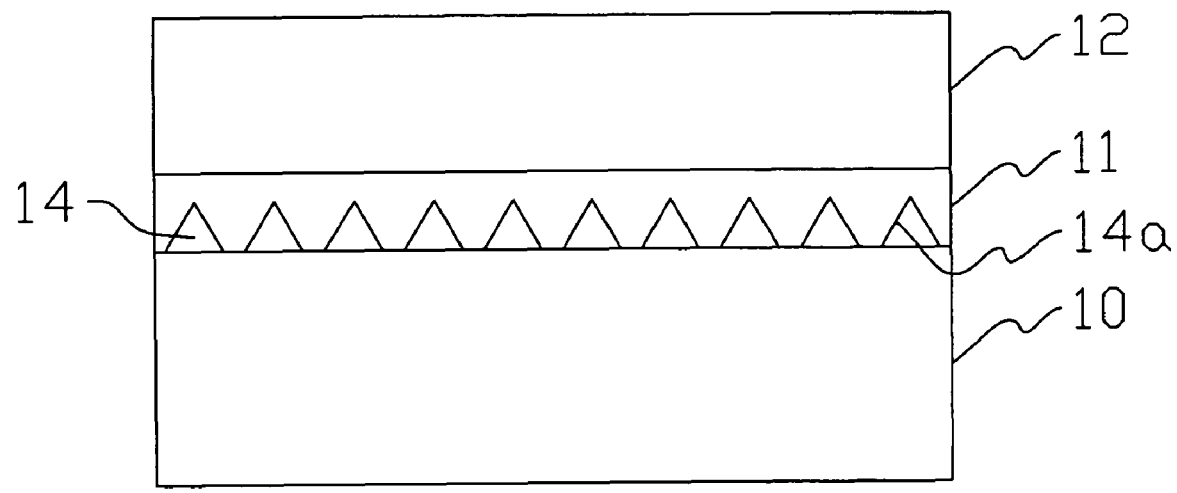

After all or part of material inside the material channels 13 is removed to expose the first nitride system 11 by the etchant, the first nitride system 11 can be further etched by an etchant which is the same as or different from that for removing the material channels 13. As the etchant gradually etching the first nitride system 11, the inner surfaces 14a of the open channels 14 gradually move or retrograde outwardly. In one embodiment, the etchant reacts with the first nitride system 11 only or with an etching rate higher than that with the sapphire substrate 10. Accordingly, from the macro scale point of view, the inner surfaces 14a of the open channels 14 move towards the direction of the first nitride system 11, as shown in FIG. 1C.

Figure 1D:
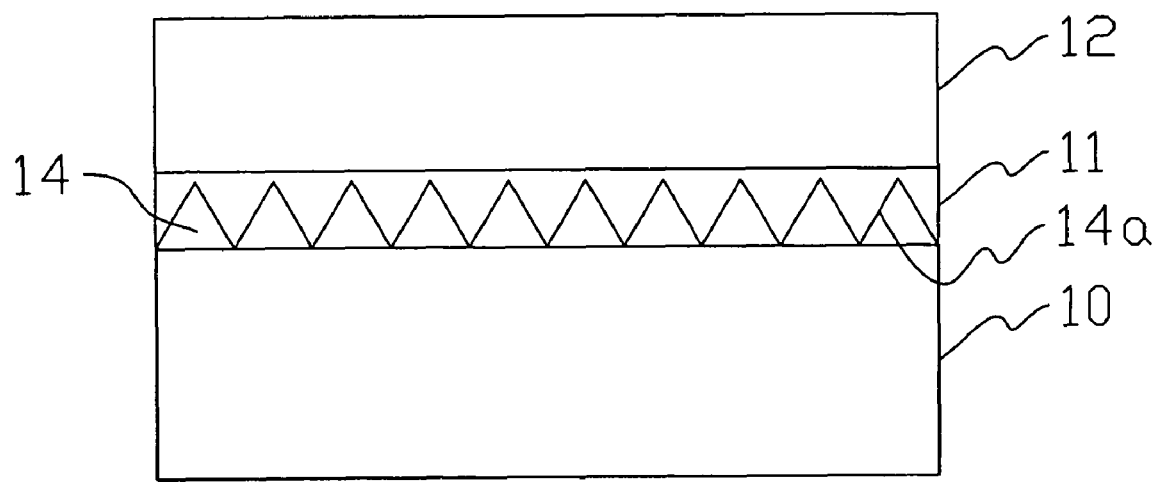

The factor probably affecting the contour of the inner surfaces 14a includes but not limited to the etchant, the lattice orientation of the exposed first nitride system 11, the geometric arrangement of the material channel, and the lattice or structural defect of the first nitride system 11. In an embodiment, the first nitride system 11 is formed by using the epitaxial lateral overgrowth method in accompany with the material channels 13 as a template. Therefore, the oxide grown on the channels 13 may be imperfect to a certain extent or has a loose structure so it can be easily etched by the etchant like potassium hydroxide. When the inner surfaces 14a approach or become a specific crystal plane group, the etching rate could be extremely slow. In other words, the specific crystal plane group can function as an etching stop plane. The specific crystal plane group is such as {11-22} or {10-11} plane group. {11-22} plane group is used in the following illustration. As shown in FIG. 1D, the inner surfaces 14a, which is not adjacent to the side of sapphire substrate, is etched to become {11-22} plane group, those inner surfaces 14a becoming {11-22} plane group theoretically has the same etching rate, accordingly the open channel 14 obtains an equilateral triangular cross section which has two equal lateral edges.

Figure 1E:
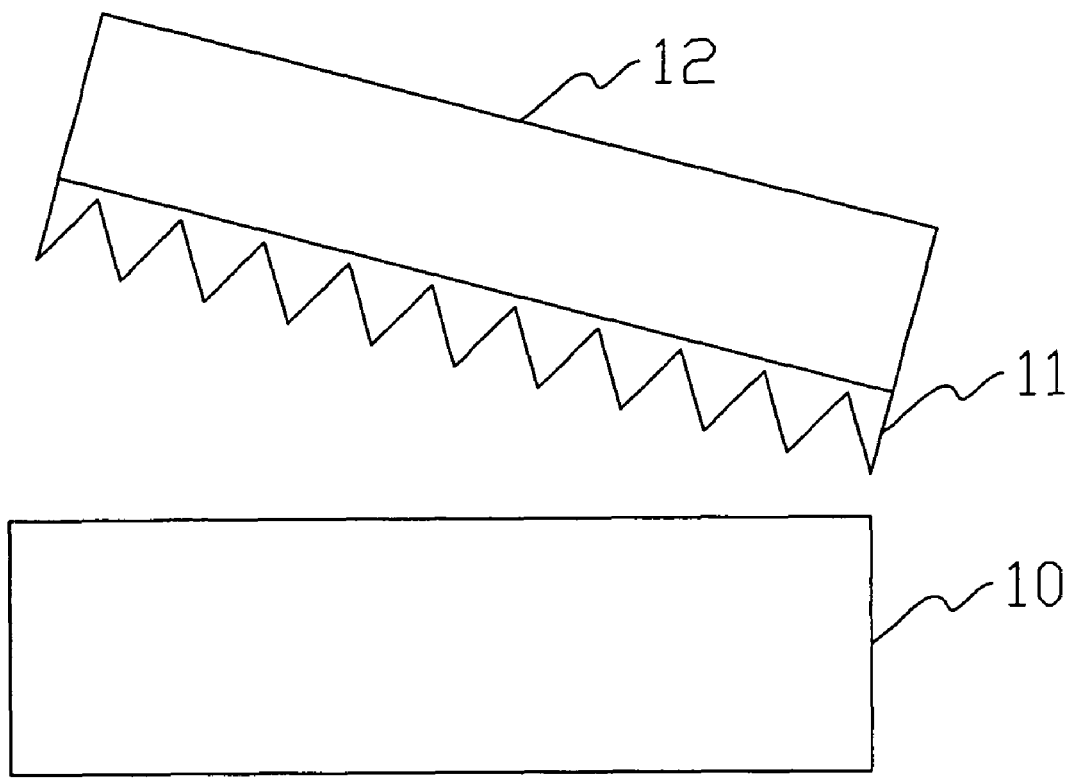

If the width and the gap of the material channels 13 are well arranged, the closet lateral side surfaces of the adjoining open channels 14 may contact with each other after etching. In another embodiment, when the closest inner surfaces 14a of {11-22} plane group contact with each other, the first nitride system 11 may be weakly connected to or completely separated from the sapphire substrate 10, as shown in FIG. 1E. In another embodiment, the {11-22} plane group intersects with the (0001) plane by 58 degree theoretically. Provided the material channels 13 and the gaps have the same or similar width, the closest inner surfaces 14a of the adjoining open channels 14 may also contact with each other, hence the nitride system 12 is separated from the sapphire substrate 10.

Figure 2:
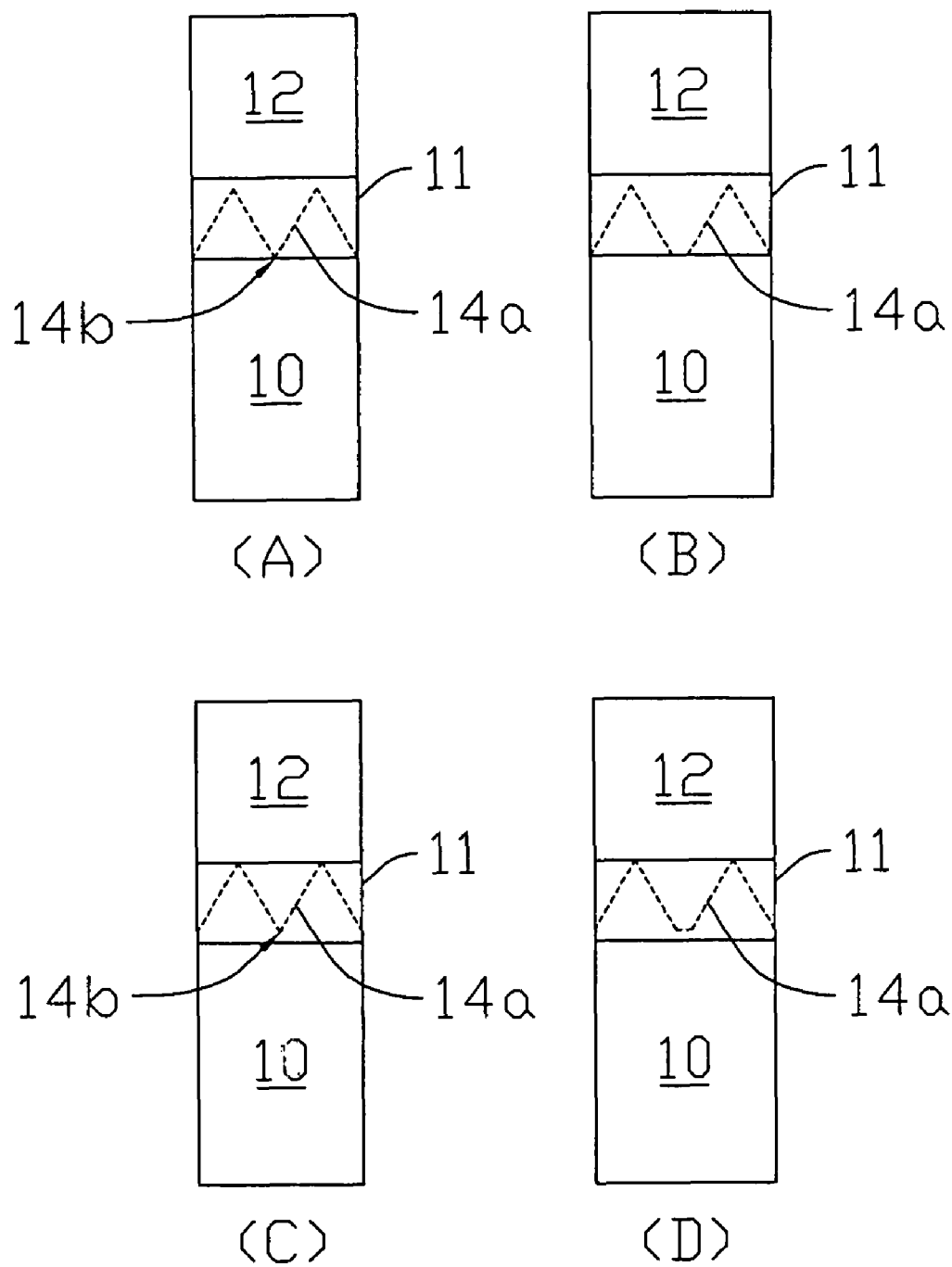
FIG. 2 illustrates several separation types in accordance with embodiments of present invention.

FIG. 2 illustrates several cross sections depicting the statuses of the inner surfaces 14a reaching the position of {11-22} plane group. In case (A), when the inner surfaces 14a reaching the position of {11-22} plane group, an intersection 14b can take place near or on the sapphire substrate 10. In that case, the first nitride system 11 is actually separated from the sapphire substrate 10. In case (B), the adjoining inner surfaces 14a are not yet contacted with each other. Since the first nitride system 11 only has a small contact area with the sapphire substrate 10, it can be easily separated from each other by exerting an external force such as vibration, sheer stress, tensile stress, compressive stress, and thermal expansion. In case (C), the inner surfaces 14a are brought to reach {11-22} plane group and contact with each other at the intersection 14b above the sapphire substrate 10. Moreover, the first nitride system 11 and the sapphire substrate 10 do not contact with each other. In case (D), the adjoining inner surfaces 14a do not contact with each other while they already reach the position of {11-22} plane group. However, the first nitride system 11 and the sapphire substrate 10 have been separated from each other. In foregoing cases, the sapphire substrate 10, the first nitride system 11, or both can be restrained, held, or fixed by a fixture.

Figure 3A:
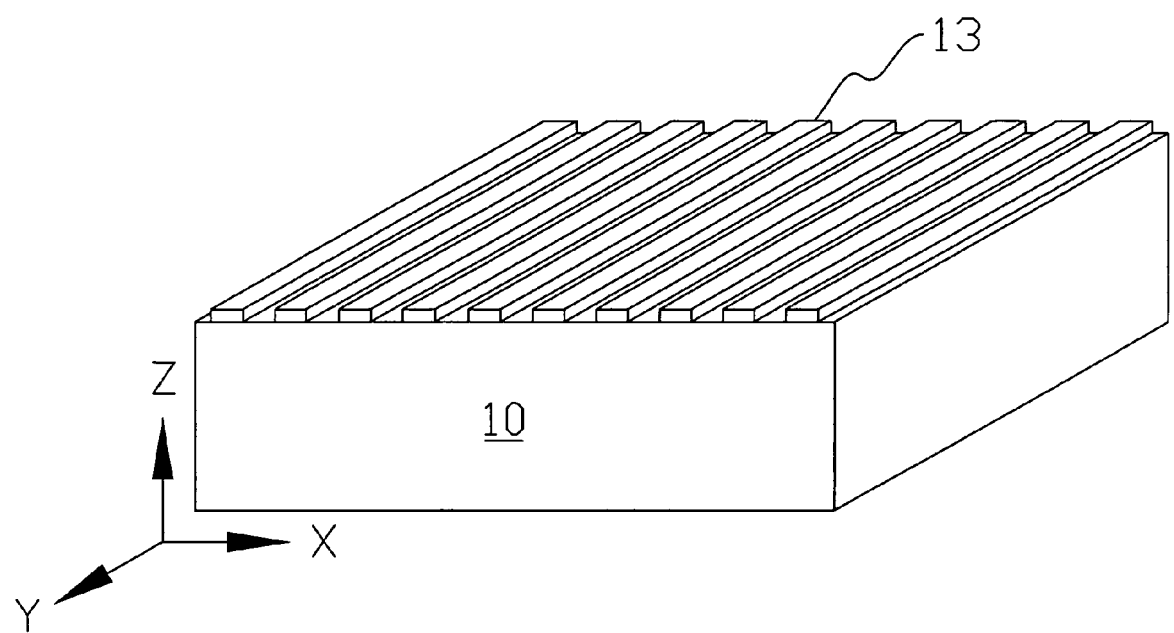
FIGS. 3A and 3B illustrate the arrangement of material channels in accordance with an embodiment of present invention.
Figure 3B:
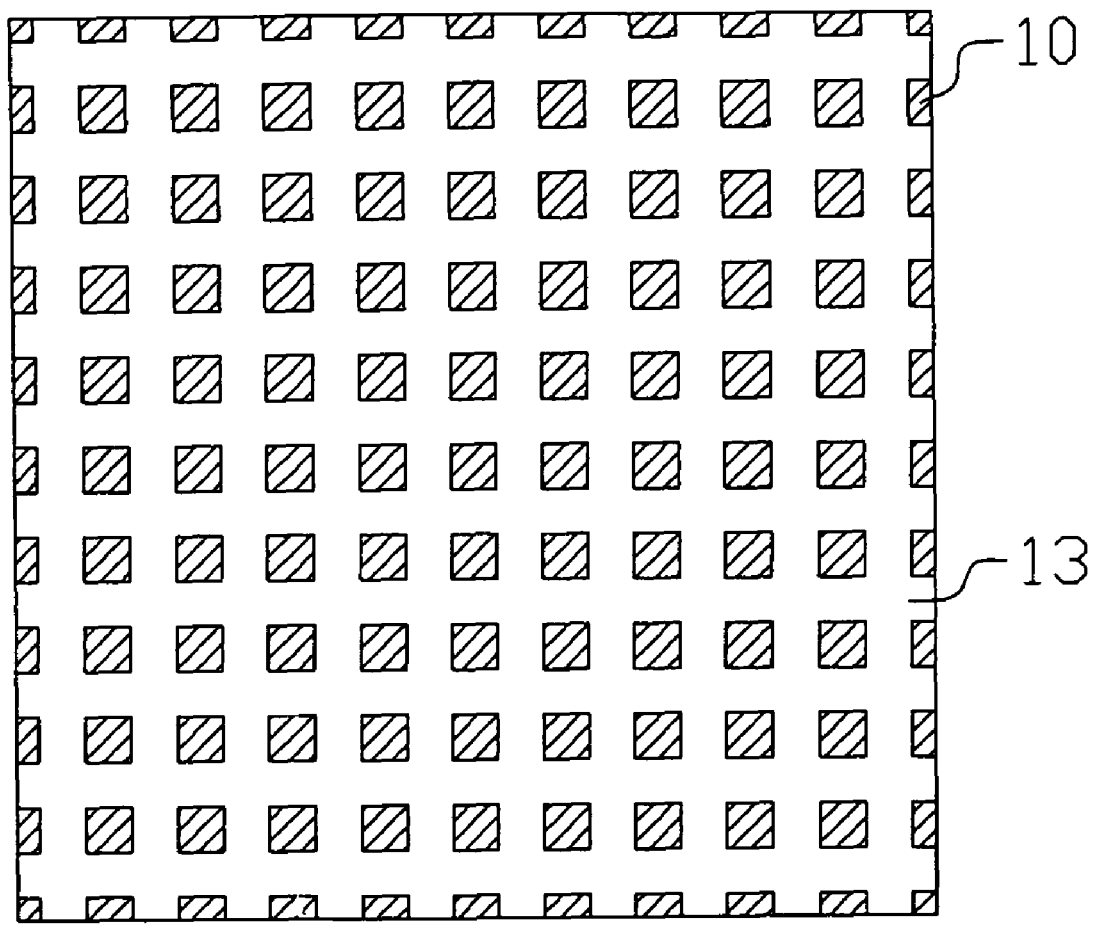

As shown in FIG. 3, the material channels 13 are assumed to have an arrangement direction on x axis and a longitudinal direction on y axis, and the normal vector of the sapphire substrate 10 is provided on z axis. In an embodiment of present invention, x axis may go along with <1-100> or <11-20> direction of sapphire substrate 10; y axis may go along with <1-100> or <11-20> direction of the sapphire substrate 10; z axis may go along with <0001> direction of the sapphire substrate 10. In the drawing, the material channels 13 are patterned in a scattered configuration. But the material channels having connecting channels among themselves can be used in each embodiment of present invention. As shown in FIG. 3, the top view of the material channels 13 appears to be a chessboard.

Figure 4:
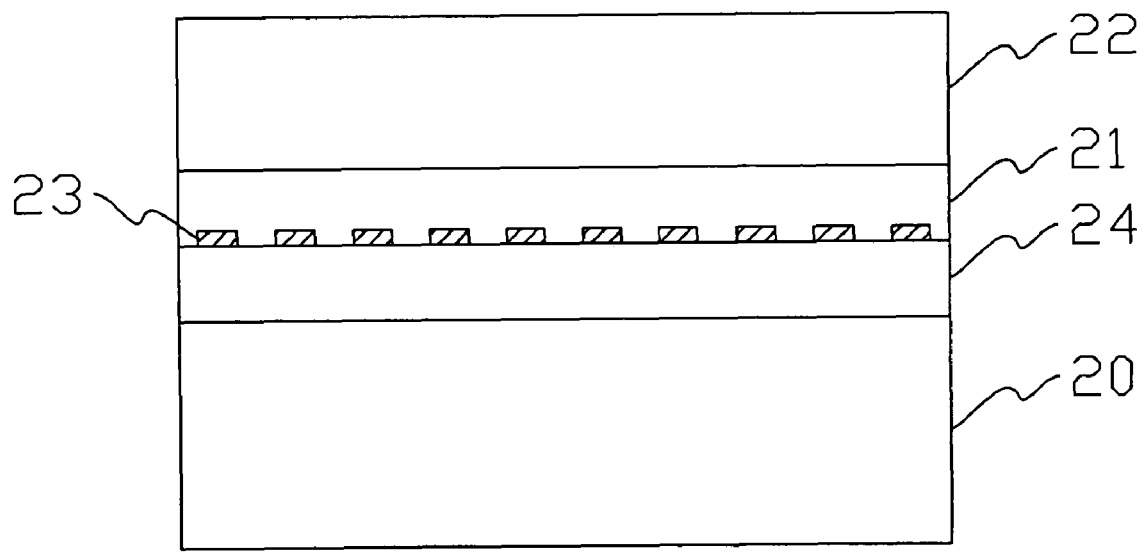
FIG. 4 illustrates a method of separating sapphire substrate in accordance with another embodiment of present invention.

As shown in FIG. 4, in another embodiment of present invention, a third nitride system 24, a first nitride system 21, and a second nitride system 22 are sequentially formed on the sapphire substrate 20. The material channels 23 are formed between the third nitride system 24 and the first nitride system 21, i.e. when the material channels are removed, the separation is made to occur on the places of the third nitride system 24 and the first nitride system 21. The first nitride system 21 has a composition such as u-GaN, n-GAN, p-GaN, AlN, InN, AlGaN, InGaN, or AlGaInN. The composition or structure of the second nitride system 22 can refer to the foregoing description of each embodiment. The third nitride system 24 has a composition including but not limited to u-GaN, AlN, AlGaN, InAlN, and a combination of AlN, GaN, and InN. The fabrication of nitride systems 21, 22, and 24 can also refer to foregoing description of each embodiment.

In aforementioned embodiments, the material channels 12 and 23 can be made of an insulator such as $SiO_2$, $Si_3N_4$, Epoxy, or benzocyclobutene, however, conductor and semiconductor may also be adopted to meet the requirement.

Figure 5A:
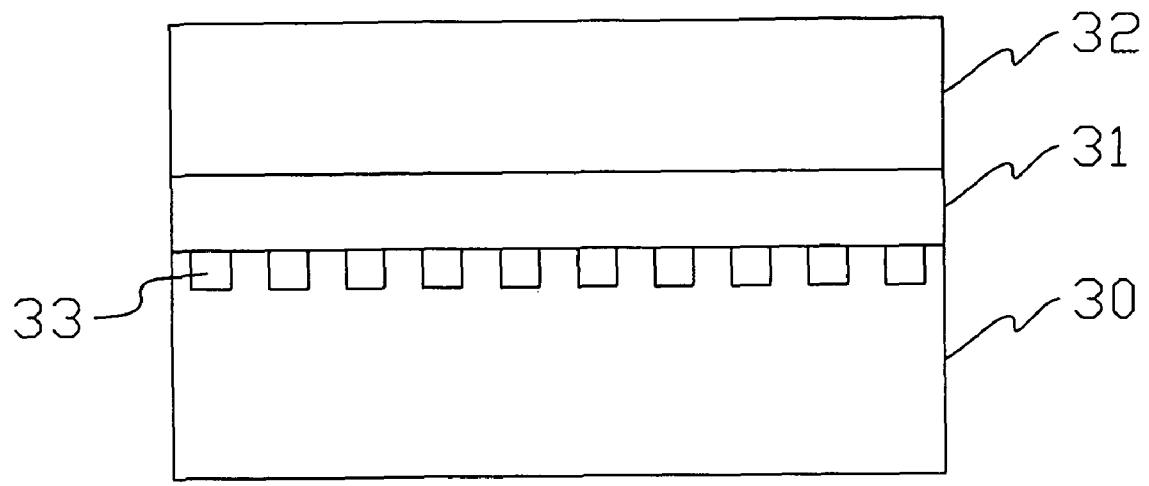
FIGS. 5A~5C illustrate a method of separating sapphire substrate in accordance with further embodiment of present invention.
Figure 5B:
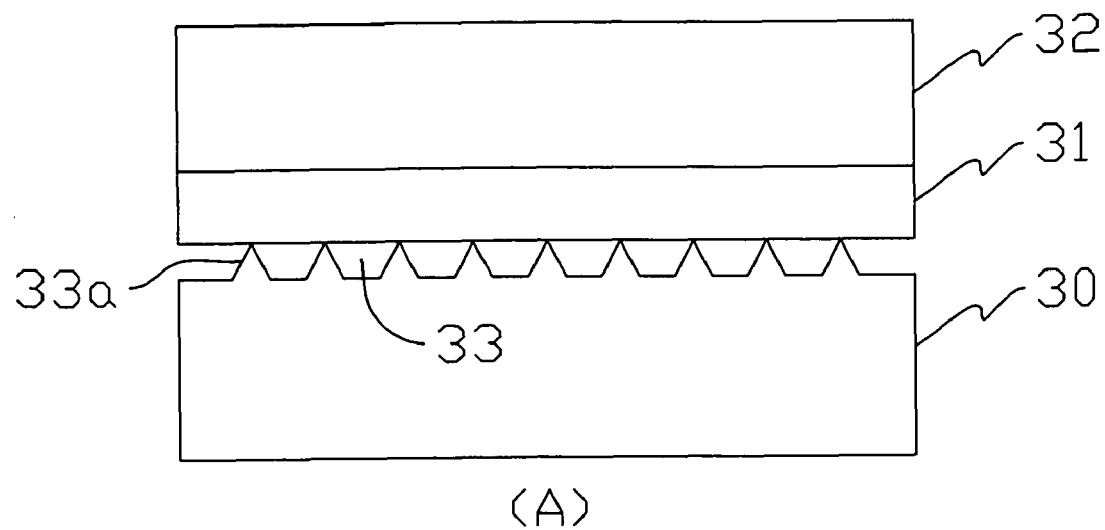
Figure 5B:
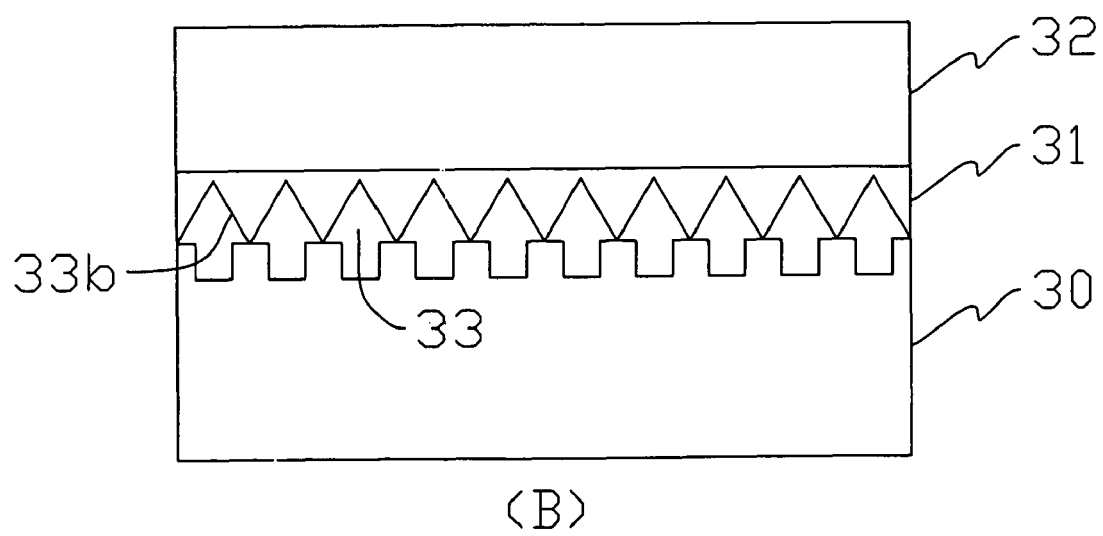
Figure 5C:
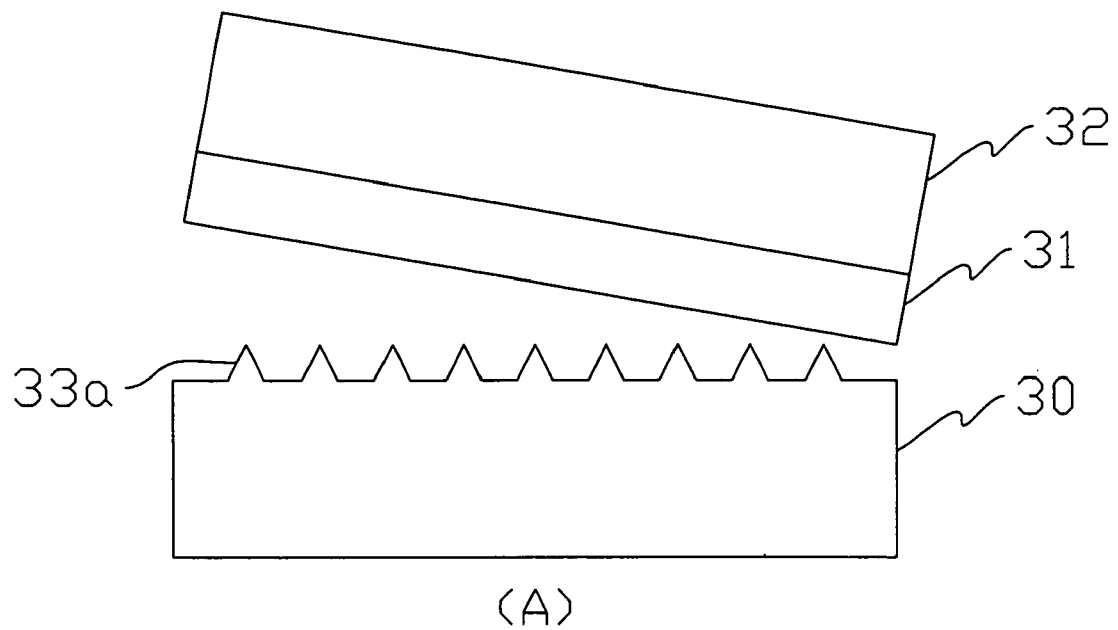
Figure 5C:
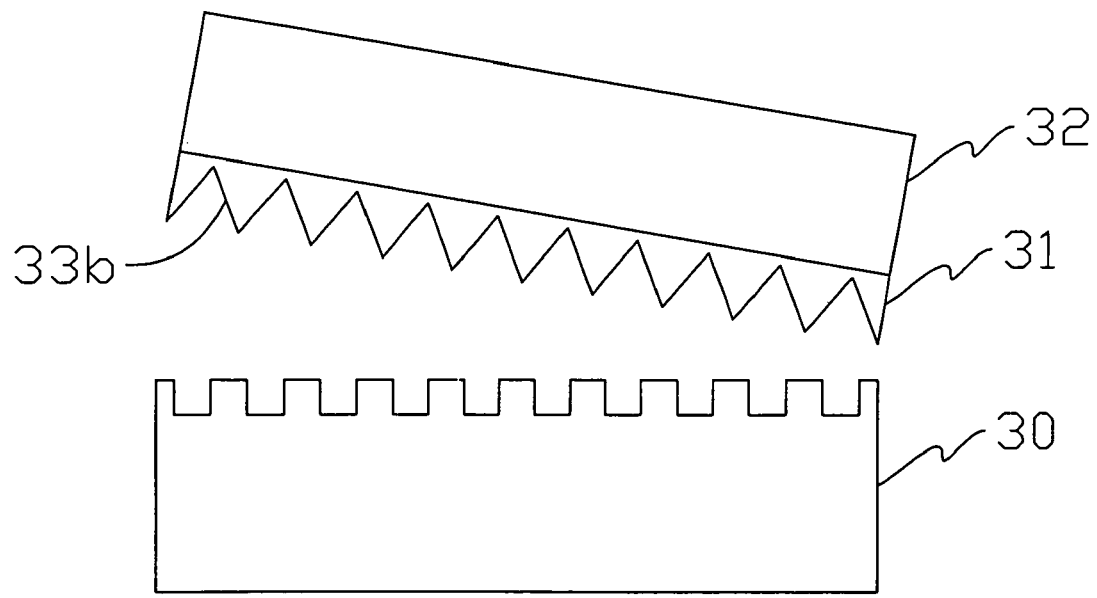

Another embodiment of present invention is shown in FIGS. 5A~5C. The open channels 33 are formed along the direction of <1-100> or <11-20> on the c-plane (0001) of the sapphire substrate 30. Firstly, the open channels 33 can be formed by using photolithography technology or dry etching technology such as reactive ion etch (RIE) and inductive coupling plasma (ICP). The first nitride system 31 and the second nitride system 32 are then formed by using metal-organic chemical vapor deposition (MOCVD), hydride vapour phase epitaxy (HVPE), or other available method. In present embodiment, after completing the system 31 and 32, the open channels 33 has enough space for flow of fluid, even though some material still remain on or inside the open channels 33. The structures, compositions, and fabrications of the first nitride system 31 and the second nitride system 32 can refer to the foregoing descriptions directing to the first nitride system 11 and the second nitride system 12 respectively. Moreover, the content of K. Tadatomo et al., phys. Stat. sol. (a) 188, No. 1, 121-122 (2001), and Y. P. Hsu et al., Journal of Crystal Growth 261 (2004) 466-470 is hereby incorporated by reference.

After the structure of FIG. 5A is accomplished, a suitable etchant is chosen to etch the open channels 33. The mechanism of the separation is affected by the kind of the etchant. As shown in FIG. 5B (A), provided the etchant has an higher etching rate of the sapphire substrate 30 than that of the first nitride system 31, the inner surface 33a of the open channels 33 are possibly etched to become a specifically oriented facet, for example, {1-102} plane group. Specifically, the plane group intersects with the c-plane of the sapphire substrate 30 by a specific greater-than-zero degree. As the etching time increasing, the inner surface 33a moves outwardly, that is, the open channel 33 expands transversely. Therefore, the contact area between the sapphire substrate 30 and the first nitride system 31 decreases as the etching time increases, until the substrate 30 is separated from, or made into an unstable or unsecure connection with the system 31, as shown in FIG. 5C (A). The etchant suitable to the above condition is like a mixture of sulfuric acid and phosphoric acid, which has an etching rate ratio of the sapphire to the nitride ranging from 50:1 to 10000:1.

As shown in FIG. 5B (B), provided the etchant has a much higher etching rate of first nitride system 31 than that of the sapphire substrate 30, the upper surfaces of the open channels 33 are bound to be etched away. In other words, the first nitride system 31 above the open channels 33 are bound to be etched away. In the case, the etching surface 33b of the first nitride system 31 can also become a specifically oriented facet, for example, {11-22} or {10-11} plane group. When the etching surface(s) 33b gradually moves outwardly, the contact area between the first nitride system 31 and the sapphire substrate 30 also decreases accordingly, until the substrate 30 is separated from the system 31, as shown in FIG. 5C (B). The etchant suitable to the above condition is like potassium hydroxide. The relative etching conditions can be referred to the explanation of potassium hydroxide in the foregoing embodiments.

The step of separating the sapphire substrate in each of the aforementioned embodiments can be deemed an individual procedure or a part of a complete manufacturing process of an optoelectronic device such as a light-emitting diode, laser, solar cell, and photo detector. Other possible step includes but not limited to etching, annealing, plating, surface roughing, adhesive bonding, anodic bonding, fusion bonding, eutectic bonding, laser lift-off, electrode forming, dicing, sorting, binning, packaging, and wire bonding.

In addition, although the aforementioned embodiments are used to explain the method of separating the sapphire substrate from the nitride system, the general idea of present invention is also suitable of separating other kinds of structures, for example, the separating interface of FIG. 4 is between two nitride systems. One of possible conditions under which each embodiment of present invention can be applied to is selecting an etchant having an etching rate difference between the two material systems located on opposite sides of the separating interface by 50~10000 order.

The foregoing description has been directed to the specific embodiments of this invention. It will be apparent; however, that other alternatives and modifications may be made to the embodiments without escaping the spirit and scope of the invention.

What is claimed is:

1. A method of separating two material systems comprising steps of:
   providing a first material system;
   forming a plurality of solid material channels on the first material system,
   wherein the solid material channels are patterned in a scattered configuration comprising connecting channels and the top view of the solid material channels are in the form of a chessboard;
   forming a second material system on the solid material channels;
   removing the solid material channels to become open channels; and
   wet-etching the open channels to shrink a direct contact area between the first material system and the second material system until a stable connection is not sustainable therebetween.

2. The method of claim 1, wherein the step of forming the first material system comprises providing a bulk sapphire.

3. The method of claim 2, wherein the step of forming the second material system comprises forming a light-emitting layer; and forming a p-type nitride layer and an n-type nitride layer on two sides of the light-emitting layer.

4. A method of separating two material systems comprising steps of:
   providing a first material system;
   forming a plurality of solid material channels on the first material system, wherein the solid material channels are patterned in a scattered configuration comprising connecting channels and the top view of the solid material channels are in the form of a chessboard;
   forming a second material system to contact the first material system in a patterned direct contact area; and
   shrinking the patterned direct contact area between the first material system and the second material system until an unsustainable connection is formed therebetween.

* * * * *